(12) United States Patent
Draxelmayr

(10) Patent No.: US 7,528,761 B2
(45) Date of Patent: May 5, 2009

(54) ANALOG/DIGITAL CONVERSION USING SUCCESSIVE APPROXIMATION AND REDUNDANT WEIGHTING

(75) Inventor: Dieter Draxelmayr, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/769,148

(22) Filed: Jun. 27, 2007

(65) Prior Publication Data

US 2008/0001804 A1    Jan. 3, 2008

(30) Foreign Application Priority Data

Jun. 28, 2006   (DE)   ........................ 10 2006 029 734

(51) Int. Cl.
*H03M 1/12* (2006.01)
(52) U.S. Cl. ...................................... 341/172; 438/381
(58) Field of Classification Search .......... 341/144–172
See application file for complete search history.

(56) References Cited

U.S. PATENT DOCUMENTS

| 4,458,237 | A | * | 7/1984 | Domogalla | 341/172 |
|---|---|---|---|---|---|
| 4,970,514 | A | * | 11/1990 | Draxelmayr | 341/153 |
| 4,999,633 | A | * | 3/1991 | Draxelmayr | 341/172 |
| 5,012,241 | A | * | 4/1991 | Kuttner | 341/120 |
| 5,675,340 | A | | 10/1997 | Hester et al. | |
| 5,719,576 | A | * | 2/1998 | Draxelmayr | 341/118 |
| 6,720,903 | B2 | * | 4/2004 | Confalonieri et al. | 341/172 |
| 6,836,236 | B2 | | 12/2004 | Horie | |
| 7,046,178 | B2 | * | 5/2006 | Draxelmayr | 341/172 |
| 7,271,758 | B2 | * | 9/2007 | Piasecki et al. | 341/172 |

OTHER PUBLICATIONS

McCreary, James, et al., "A High-Speed, All-MOS Successive-Approximation Weighted Capacitor A/D Conversion Technique", IEEE International Solid State Circuits Conference 1975, pp. 38-39.
Boyacigiller, Ziya G., et al., "An Error-Correcting 14b/20us CMOS A/D Converter", us 1981, pp. 62-63.
Kuttner, Franz, "A 1.2V 10b 20Msample/s Non-Binary Successive Approximation ADC in 0.13um CMOS", IEEE International Solid State Circuits Conference 2002.
Ginsburg, Brian P., et al., "An Energy-Efficient Charge Recycling Approach for a SAR Converter with Capacitive DAC", IEEE 2005, pp. 184-187.

* cited by examiner

*Primary Examiner*—Lam T Mai
(74) *Attorney, Agent, or Firm*—Banner & Witcoff, Ltd.

(57) ABSTRACT

Illustrative binary networks for analog/digital converters are described. For instance, an analog/digital converter may operate in accordance with a principle of successive approximation, and may include a plurality of N+1 circuit nodes each representing one of N binary weights and $M \geq 1$ redundant binary weights, wherein each binary weight corresponds to a different position of a redundant binary code formed as part of the approximation. Illustrative methods of operation of the binary network and/or the analog/digital converter are also described.

11 Claims, 3 Drawing Sheets

ANALOG/DIGITAL CONVERSION USING SUCCESSIVE APPROXIMATION AND REDUNDANT WEIGHTING

CROSS-REFERENCE TO RELATED APPLICATIONS

This application claims priority to German Patent Application 10 2006 029 734.2, filed Jun. 28, 2006, hereby incorporated by reference as to its entirety.

BACKGROUND

The functional principle of successive approximation represents a potentially useful operating method for analog/digital converters. In this method, a digital value is determined from an analog input voltage using an iterative search process. For this purpose, the analog input voltage to be converted is compared with an analog threshold voltage by means of a comparator. The threshold voltage itself is generated by the digital/analog converter. The digital input word of the digital/analog converter is generated by a successive approximation register (SAR), which is connected so as to follow the comparator. The digital input word is successively approximated to the required digital value by systematically varying the digital input word in accordance with the signal at the comparator output.

A binary network is often used to implement the digital/analog converter such that a different weight is allocated to each bit of the input word. The weight is set in accordance with the respective bit value. The weights of such a binary network are binary-weighted, i.e. their weight values are related to one another in powers of two. Such binary networks are typically implemented by means of binary-weighted current sources, an R-2R resistance network, or binary weighted capacitors.

Instead of the binary search strategy described above, non-binary approaches (for example with a base of 1.85 instead of 2) have also been conceived that provide digital/analog converters with redundancy. Although such systems require more clock cycles due to the redundancy, the systems can be clocked more rapidly so that such a non-binary search strategy can still produce results more rapidly.

However, compared with binary networks, non-binary networks have the potential disadvantage that the individual weights, in principle, exhibit relatively poor matching. Moreover, any self-calibration of the weights in a non-binary network may be relatively complex.

SUMMARY

Illustrative binary networks for analog/digital converters are described. For instance, an analog/digital converter may operate in accordance with a principle of successive approximation, and may include a plurality of circuit nodes each representing one of a plurality of binary weights and at least one redundant binary weight, wherein each binary weight corresponds to a different position of a redundant binary code formed as part of the approximation. Illustrative methods of operation of the binary network and/or the analog/digital converter are also described.

These and other aspects of the disclosure will be apparent upon consideration of the following detailed description of illustrative aspects.

BRIEF DESCRIPTION OF THE DRAWINGS

A more complete understanding of the present disclosure may be acquired by referring to the following description in consideration of the accompanying drawings, in which like reference numbers indicate like features, and wherein.

DETAILED DESCRIPTION

Figure 1:
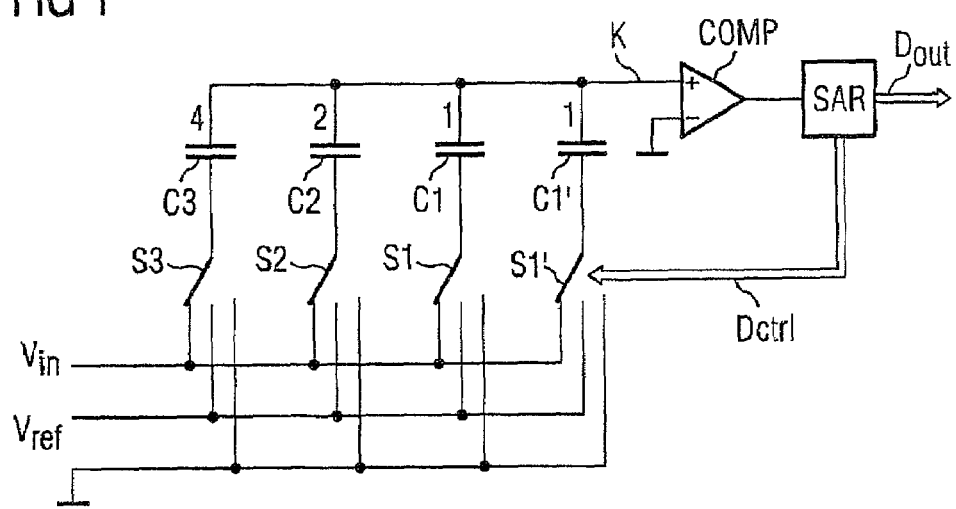
FIG. 1 is a schematic diagram of an illustrative embodiment of an analogue/digital converter that uses charge redistribution.

The various aspects summarized previously may be embodied in various forms. The following description shows by way of illustration various examples in which the aspects may be practiced. It is understood that other examples may be utilized, and that structural and functional modifications may be made, without departing from the scope of the present disclosure.

Except where explicitly stated otherwise, all references herein to two or more elements being "coupled" or "connected" to each other is intended to broadly include both (a) the elements being directly connected to each other, or otherwise in direct communication with each other, without any intervening elements, as well as (b) the elements being indirectly connected to each other, or otherwise in indirect communication with each other, with one or more intervening elements. Furthermore, it should be appreciated that functional blocks or units shown in the drawings may be implemented as separate circuits in some embodiments, but may also be fully or partially implemented in a common circuit in other embodiments.

Various illustrative embodiments as described herein relate to binary networks for digital/analogue conversion that operate in accordance with the principles of successive approximation, and methods of operation thereof.

FIG. 1 shows a simplified block diagram of an embodiment of an analog/digital converter that uses a binary network. In this case, the weights are implemented by means of capacitors. Such a capacitor implementation may be referred to a charge redistribution method. The analog/digital converter shown in FIG. 1 has a resolution of N=3 bits of digital output word $D_{out}$. The weights of the binary network are implemented by means of three capacitors C3, C2 and C1, wherein the capacitors C3, C2 and C1 are in each case allocated to one bit of the output word $D_{out}$ in the order shown, starting from the most significant bit (MSB). Due to the binary weighting, the following applies to the capacitance values Ci (with $i \in [1, \ldots, 3]$):

$$Ci = Cj \cdot 2^{(i-j)} \qquad \text{(equ. 1)}$$

If the capacitance value of the capacitor C1 of the least significant bit (LSB) is normalized to one unit of capacity, the capacitance values entered in FIG. 1 are obtained for the remaining capacitors C2 and C3.

In FIG. 1, an additional capacitor C1' is used for compensating for gain errors in that the input charge is stored in a total capacitance of eight capacitance units instead of seven capacitance units without C1'. The capacitors C3, C2, C1 and C1' are in each case connected to a common charge node K which is connected to the positive input of a comparator COMP.

In the sampling phase (also called sequence phase) of the embodiment of FIG. 1, the node K is connected to ground (not shown), whereas the bottom terminal of each of the capacitors C3, C2, C1 and C1' is connected to the input voltage $V_{in}$ via separate switches S1 to S3 and S1', respectively. This may result in a charging of the node K with a charge dependent on the input voltage $V_{in}$.

At the beginning of the conversion phase that follows, the connection to ground (not shown) is opened such that the bottom terminals of the capacitors C3, C2, C1 and C1' are connected to ground via switches S1 to S3 and S1', respectively. Since the charge at the node K is maintained during this process, the potential of node K jumps to $-V_{in}$.

Next, the capacitors C3, C2 and C1 are sequentially connected via switches S1 to S3 to the reference voltage $V_{ref}$. The switches S1 to S3 of the are controlled by the SAR, which is connected to the output of the comparator COMP. In the arrangement of FIG. 1, the digital control signal $D_{ctrl}$ of the SAR corresponds to the output word $D_{out}$, (apart from the switching information for the switch position $V_{in}$).

The potential of the node K is compared with the ground potential after each charge redistribution, which in turn causes each bit, starting from the MSB to the LSB of the digital word $D_{out}$, to be generated.

It is noted that the capacitance of any given weight may be split into a number of individual capacitances, which may reduce the switching energy.

As will be described with reference to FIGS. 2 and 3, it may be desirable to provide an analog/digital converter operating in accordance with the principle of successive approximation that may be clocked with the higher speeds of non-binary networks, yet that may still utilize the relatively simple circuit technology of binary networks.

Such an analog/digital converter may utilize, for instance, a binary network having N binary weights and additionally at least one redundant binary weight. In such an arrangement, each weight (including the redundant weight) may correspond to a different position within a redundant binary code formed as part of the approximation. The term "binary code" as used herein broadly refers to any code having sequences of any two different symbols (for example 1 or 0), and is not limited to values in which the individual positions therein correspond to powers to the base of 2.

A potential advantage of utilizing at least one redundant weight may be realized in that the operating clock rate may be increased. This is because it may now be possible to compensate for a wrong decision caused by the increased clock rate by means of the redundant weight during the conversion process. At the same time, and in contrast to the non-binary alternative mentioned previously, the use of a binary network may allow for the design of a relatively simple circuit configuration without necessarily experiencing the potential matching or self-calibration problems of non-binary networks.

The weight value of the redundant weight, i.e. the bit position significance of the redundant weight, may correspond to the weight value of the Mth most significant weight of the N binary weights (with M∈[N, . . . , 1]). This may make it possible to compensate for wrong decisions from the most significant bit to the Mth most significant bit.

Further, it may be desirable to provide, rather than a single redundant weight, a plurality of redundant weights each having a different weight value. Each redundant weight may correspond to a different weight value of the N binary weights.

According to various illustrative embodiments, the weights may be constructed so as to be capacitive, however other forms of implementation of the weights such as, for example, binary-weighted current sources, may be used in the context of the present disclosure. It may further be desirable to implement the weights by means of split capacitors. The use of split capacitors and the resultant potential advantages thereof will be explained in the text which follows in the description of the figures.

According to further illustrative embodiments, when capacitive weights are used during sampling of the input signal, the weights from the most significant weight to the Mth most significant weight and the one or more redundant weights may be electrically conductively connected to the input signal. This may result in the capacitors being charged up with a charge dependent on the input voltage, wherein the charge may be stored in $2^N$ capacitance units (for example in eight capacitance units in FIG. 1 with N=3 bits), and wherein the capacitance value of the LSB corresponds to one capacitance unit. For this purpose, all capacitances of the N weights and the additional capacitance (see FIG. 1) may be connected to the input voltage. In contrast, by using one or more redundant weights, all capacitances from the most significant weight to the Mth most significant weight and the one or more redundant weights may be advantageously connected to the input voltage so that the charge is stored in this manner in $2^N$ capacitance units. In this case, the switch position, which in each case connects to the input voltage the (M−1) most significant weight down to the least significant weight, may not be needed. The additional capacitor for preventing a gain error may thus be obsolete.

Figure 2:
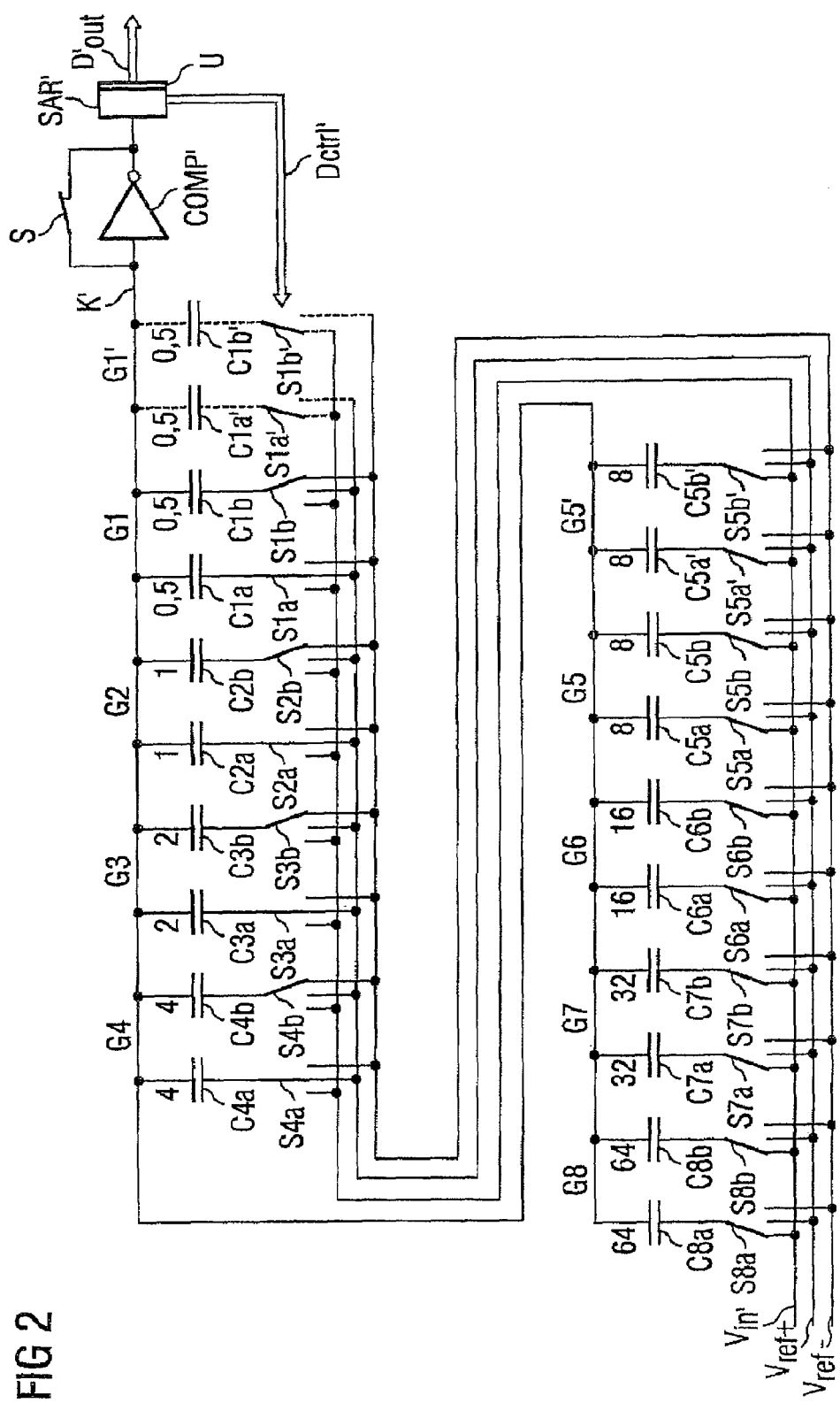
FIG. 2 is a schematic diagram of an illustrative embodiment of a binary network as part of an illustrative analogue/digital converter during a sampling phase, in accordance with various aspects described herein.

FIG. 2 shows an illustrative embodiment of a binary network as part of an analog/digital converter. In this example, the analog/digital converter is an eight bit (N=8) system. However, N may be of any value. In this illustrative embodiment, N=8 binary weights G1 to G8 and additionally a redundant weight G5' are provided, in which weight G1 corresponds to the LSB and weight G8 corresponds to the MSB.

The binary network of FIG. 2 is implemented by means of binary-weighted capacitors C1a/b to C8a/b and C5a'/b', the normalized capacitance values specifying the weight value of the respective weight. Resistive weight approaches may additionally or alternatively be used. Furthermore, the capacitors of the network may be implemented as split capacitors. In other words, each weight may include two equally large capacitors Cia/b. Depending upon whether split capacitors are used or not, the switch activity may be slightly different, as will be described.

Due to the binary weighting, the following may apply to the capacitance values Cia/b (with i∈[1, . . . , 8]) of the N=8 binary weights:

$$Cia/b = Cja/b \cdot 2^{(i-j)} \quad \text{(equ. 2)}$$

If the capacitance value of the capacitors C1a and C1b of the weight of the LSB is normalized to one capacitance unit, the capacitance values shown in FIG. 2 may be obtained for the remaining capacitors C2a/b to C8a/b. In this arrangement, the capacitance values of the redundant weight G5' may correspond to those of the weight G5 (i.e. of the Mth most significant weight, with M=4 in this example).

The last weight G1', shown in FIG. 2 as connected via dashed lines (with C1a'/b'=C1a/b), is optional in this embodiment and, like the last weight in FIG. 1, may be used for reducing or even preventing gain errors by storing the input charge in $N=2^8=256$ capacitance units. The capacitance value of the capacitors C1a' and C1b' may correspond to the capacitance value of the capacitors C1a and C1b of the weight G1 with the lowest weight factor of the N binary weights. Under certain conditions, the weight G1' may be omitted without causing a gain error, as will be explained below.

For the individual weights G1 to G8 and G5' (and optionally G1'), switches S1a/b to S8a/b, S5a'/b' and S1a'/b', respectively, are provided to connect the capacitors Cia/b and C5a'/b' of the individual weights to the input voltage $V_{in'}$ or the reference voltages $V_{ref+}$ (for example $V_{DD}$) and $V_{ref-}$ (for example earth) depending on the switch position. Instead of the switches S1a/b to S8a/b, S5a'/b' and S1a'/b' having three switching options as shown, a number of simple switches may be interconnected with one another in such a manner that the same switching functions are provided.

The capacitors in the embodiment of FIG. 2 are each connected at their top terminal to a common charging node K' that corresponds to the node K from FIG. 1. The node K' is connected to the input of a comparator COMP', which is implemented as an inverter in FIG. 2. The inverter COMP' may be bypassed by closing a switch S so that the output of the inverter COMP' is approximately in the middle between the high and the low potentials. Rather than an inverter, a differential amplifier may be used, such as in FIG. 1. In such a case, the negative input of the differential amplifier may coincide with the node K'. As shown, the output of the inverter COMP' is connected to an approximation register SAR' that controls the switches of the binary network via the digital signal $D_{ctrl'}$ and outputs the required digital word $D_{out'}$ in binary code representation.

In the first clock phase (sampling phase), a charge dependent on the input voltage $V_{in'}$ may be stored in a total capacitance of $2^N=2^8=256$ capacitance units. For this purpose, the switch S may be closed as shown in FIG. 2. Furthermore, in a binary network without any redundant weights, all switches S1a/b to S8a/b of the weights G1 to G8 and the switch S1a'/b' of the weight G1' may be connected to $V_{in'}$ as shown in FIG. 2. The sum of the capacitors connected to the voltage $V_{in'}$ may correspond to $2^N=256$ capacitance units. This may also be accomplished when using a redundant weight (G5' in this example), such that the capacitors C5'/b' of the redundant weight G5' are excepted from this and are not connected to the voltage $V_{in'}$ to allow for a total charging capacitance of $2^N=256$ capacitance units. In this example, the capacitors C5a' and C5b' of the redundant weight G5' are connected to $V_{ref+}$ and $V_{ref-}$ via the switches S5a' and S5b', respectively.

As an alternative, when using one or more redundant weights, a total charging capacitance of $2^N=256$ capacitance units may be provided in a simple manner by applying the input voltage $V_{in'}$ to all capacitors from weight G8 of the MSB to the capacitors of the redundant weight G5' (that is to say capacitors C8a/b to C5a'/b') and charging the capacitors C1a/b to C4a/b of the least significant weights G1 to G4 to $V_{ref+}$ and $V_{ref-}$, respectively. The switch position $V_{in'}$ for the switches S1a/b to S4a/b of the least significant weights G1 to G4 may be omitted in this case. In addition, the weight G1' (shown connected via dashed lines) may be saved in this case (unless a special offset setting is attempted).

In the subsequent discussions, the weight G1' therefore may be no longer taken into consideration. FIG. 2 shows the charging by means of the weights G8 to G5', wherein the weight G1' is not taken into consideration.

In the shown embodiment, the conversion phase begins from the second clock phase, in which the search for the digital value takes place by means of successive approximation using the charge redistribution method. The charge at the node K', which depends on the input voltage $V_{in'}$, may be frozen when the switch S is opened. Furthermore, switches S1a to S8a and S5a' and switches S1b to S8b and S5b' may be first set to the positions $V_{ref+}$ and $V_{ref-}$, respectively, so that the middle voltage between $V_{ref+}$ and $V_{ref-}$, i.e. $(V_{ref+}+V_{ref-})/2$, is additionally superimposed onto the potential at the node K'. The output of the comparator COMP' then switches to either high or low depending upon the comparison of the stored input voltage with the middle voltage between $V_{ref+}$ and $V_{ref-}$. Depending on the decision of the comparator COMP', either the capacitor C8b is connected to $V_{ref+}$ or the capacitor C8a is connected to $V_{ref-}$ beginning with the weight C8 of the MSB. After the second clock step, both capacitors C8a/b are thus at the same potential $V_{ref+}$ or $V_{ref-}$, which, at the same time, specifies the MSB of the required digital word and pushes the entire voltage structure upward (both capacitors C8a/b are at $V_{ref+}$) or downward (both capacitors C8a/b are at $V_{ref-}$).

In the next clock step, the switch positions of the weight G7 may be specified in the same manner to determine the second most significant bit. In subsequent clock steps, the weights G6 and G5 and the associated bits may be progressively determined. Without consideration of the redundant weight, this would analogously apply also to the weights G4 to G1 and the bits associated with these weights so that the individual bits of the required digital word would be defined by the switch positions of the weights G1 to G8 in binary code representation. However, without consideration of the redundant weight, there may be an increased risk in such a successive conversion that a wrong decision will be made (for example of the MSB), particularly due to an increased clock rate, that can no longer be corrected during the successive conversion process.

On the other hand, when a redundant weight is used (G5' in the present case), it may be possible that a wrong decision of a weight can be corrected with a weight value, i.e. with a capacitance value of greater than or equal to the weight value of the redundant weight. This is because, in this case, the sum of the least significant weights including the redundant weight may be greater than is actually required for a conversion.

For instance, taking into consideration the redundant weight G5', the switch position of the weight G5' may be determined before establishing the weights G4 to G1, and only then the switch positions of the weights G4 to G1 would be progressively determined. The redundant weight G5' thus may be included in the usual conversion process. FIG. 3 shows the illustrative embodiment of FIG. 2 at the end of the conversion phase.

During the redundant conversion, a word of a redundant binary code that has N+n positions (where n=number of redundant weights; for example n=1 in the present case) is first determined internally in the analog/digital converter, rather than a word of a binary code having only N positions without the redundancy. This redundant binary code may be converted into the output word $D_{out'}$ in binary code representation in the manner described hereafter, by means of a converter U that is part of the approximation register SAR'. As an alternative, the converter U may be implemented as separate circuit block independent of the approximation register SAR'.

If, for example, the input voltage $V_{in'}$ is slightly greater than the middle voltage between $V_{ref+}$ and $V_{ref-}$ and the MSB has been incorrectly set to 0 instead of 1, a conversion without redundancy would lead to a code word such as "0111 1111". In the case of a redundant conversion, as in FIG. 2, this same erroneous MSB may produce, for example, a code word "0111 1 0010", i.e. the bit of the redundant weight G5' is set to 1 as the fifth bit of the redundant binary code. FIG. 3 shows the switch position and the corresponding control signal $D_{ctrl'}$ for this code example.

An illustrative embodiment of conversion of the redundant binary code into the output word $D_{out'}$ in binary code representation by the converter U will now be described. In this context, it is assumed that the input voltage $V_{in'}$ is applied to all capacitors of weight G8 of the MSB up to the capacitors of the redundant weight G5' (i.e. the capacitors C8a/b to C5a'/b') and that capacitors C1a/b to C4a/b of the least significant weights G1 to G4 are charged up to $V_{ref+}$ and $V_{ref-}$, respectively.

The charge redistribution method in this example is based on the fact that the sum of all capacitance-voltage products of the capacitors Cia/b and C5a'/b' connected to the common charge node K', i.e. the charge Q at the charge node K', remains constant after the charge node K' has been charged up with the voltage $V_{in'}$. In other words, $$\sum_i Cia/b \cdot Via/b + C5a'/b' \cdot V5a'/b' = const. \quad (equ. 3)$$

Via/b and V5a'/b' in this example refer to the voltage across the capacitors Cia/b and C5a'/b', respectively. As described above, the capacitors C8a/b to C5a'/b' are first charged up with the input voltage $V_{in'}$. In addition, the capacitors C1a/b to C4a/b of the least significant weights G1 to G4 are charged up to $V_{ref+}$ and $V_{ref-}$, respectively (Cia to $V_{ref+}$ and Cib to $V_{ref-}$). To simplify, it will be assumed for the sake of illustration that $V_{ref-}=0$ V applies. The following would thus initially apply:

$$\sum_{i=5}^{8} Cia/b \cdot V'_{in} + C5a'/b' \cdot V'_{in} + \sum_{i=1}^{4} Cia \cdot V_{ref+} = \quad (equ. 4)$$

$$256\ V'_{in} + 8\ V_{ref+} = const.$$

After the conversion process, the following would apply:

$$\sum_i Di \cdot Cia/b \cdot V_{ref+} + D5' \cdot C5a'/b' \cdot V_{ref+} = const \quad (equ. 5)$$

The quantities Di and D5' in each case describe whether the corresponding bit of the binary code is set (e.g., Di=1) or not set (e.g., Di=0). On the basis of the charge conservation in equ. 3, equ. 4 and equ. 5, the following is true in the present example:

$$256\ V'_{in} + 8\ V_{ref+} = \sum_i Di \cdot Cia/b \cdot V_{ref+} + \quad (equ. 6)$$

$$D5' \cdot C5a'/b' \cdot V_{ref+}$$

And, equ. 6 may be transformed into the following form:

$$256 \frac{V'_{in}}{V_{ref+}} = \sum_i Di \cdot Cia/b + D5' \cdot C5a'/b' - 8 \quad (equ. 7)$$

The left-hand expression in equ. 7 is a quantity less than or equal to 256, proportional to the input voltage, and corresponds to the output word $D_{out'}$ in binary code representation. This quantity is given by the code value of the set weights Gi and G5' reduced by $8=1000|_{binary}$. In dependence on the redundant binary code, the output word $D_{out'}$ thus may be represented as the binary code without the bit D5' associated with the redundant weight G5', the value of this bit being added in accordance with the weighting of the redundant weight G5' (that is to say, $+10000|_{binary}$ or $+00000|_{binary}$) and an offset value being subtracted in accordance with the charging of the least significant weights G1 to G4. The offset value may be selected arbitrarily, for example, by preallocating the least significant weights G1 to G4. In particular, the offset value can also be selected as a predetermine value such as 0. Or, as mentioned above, the offset may be selected as $2^{(N-M-1)}$ ($8=1000|_{binary}$ in the present case).

Equ. 7 also shows that it may be useful to charge the input voltage $V_{in'}$ to a normalized total capacitance that represents a power of 2 (256 in the present example). This may reduce or even prevent any need for the output word $D_{out'}$ to be recalculated in a complicated manner and/or a gain error from having to be accepted.

The redundant binary code "0111 1 0010," mentioned by way of example above, may be recalculated in the converter U according to equ. 7 into the output word $D_{out'}$ "01111010" in binary code representation, as follows:

$$0111\ 1\ 0010|_{redundant}=01111010|_{binary}+10000|_{binary}-1000|_{binary}=01111010|_{binary}$$

Thus, the MSB of the output code $D_{out'}$ may be set correctly in spite of a previous wrong decision of the MSB of the binary code internal to the converter.

If the conversion process has begun with the MSB set correctly, a redundant binary code may be obtained, such as "1000 0 0010." This may be recalculated into the output word $D_{out'}$ "01111010" in binary code representation in accordance with equ. 7, as follows:

$$1000\ 0\ 0010|_{redundant}=10000010|_{binary}+00000|_{binary}-1000|_{binary}=01111010|_{binary}$$

The two aforementioned examples of redundant binary codes "0111 1 0010" and 1000 0 0010" are equal in value, because in both cases the same output word $D_{out'}$ "01111010" is obtained in binary code representation. This is understandable against the background that both redundant binary codes correspond to the same total capacitance set, namely 64+32+16+16+2=130 in the case of the redundant binary code "0111 1 0010" and 128+2=130 in the case of the redundant binary code "1000 0 0010".

Analogously, the redundant binary codes "0111 1 1010" and "1000 0 1010" may be recalculated in the converter U, in accordance with equ. 7, into the same output word $D_{out'}$ "10000010" in binary code representation, as follows:

$$0111\ 1\ 1010|_{redundant}=01111010|_{binary}+10000|_{binary}-1000|_{binary}=10000010|_{binary}$$

$$1000\ 0\ 1010|_{redundant}=10001010|_{binary}+00000|_{binary}-1000|_{binary}=10000010|_{binary}$$

It has been previously explained that the output word $D_{out'}$ may be represented in dependence on the redundant binary code as the binary code without the bit allocated to the redundant weight, the value of this bit being added in accordance with the weighting of the redundant weight and the offset value $2^{(N-M-1)}$ (8 in the present case) being subtracted. This may also be assisted by adding the value $2^{(N-M-1)}$ ($8=1000|_{binary}$ in the present case) to the binary code without the bit allocated to the redundant weight if this bit corresponds to the value 1, or by subtracting the value $2^{(N-M-1)}$ from the binary code without the bit allocated to the redundant weight if this bit corresponds to the value 0. The difference between the two cases again corresponds to the weight value $2^{(N-M)}$ ($16=10000|_{binary}$ in the present case) of the redundant weight. It is noted that the code allocation may also be stored permanently in a lookup table.

In the illustrative embodiments described in connection with FIG. 2 and FIG. 3, split capacitors Cia/b and C5a'/b' have been used for the weights in contrast to the analog/digital converter shown in FIG. 1. An appropriate choice of the offset value as $2^{(N-M-1)}$ may allow not only for correction of wrong decisions towards greater values but also of wrong decisions symmetrically down to smaller values. A correction towards greater or lesser values may be implemented by adding the weight value of the redundant weight $2^{(N-M)}$ and subtracting the offset value $2^{(N-M-1)}$ or by subtracting the offset value $2^{(N-M-1)}$, respectively. When using such a binary network without split capacitors (e.g., with simple capacitors as in FIG. 1), a correction towards greater or lesser values may be achieved in the same way by preallocating the least significant weights, for example by connecting the (M−1) most significant weight G4 (implemented by means of a simple capacitor) to $V_{ref}$ while connecting the weights G1 to G3 (again, implemented in each case by means of a simple capacitor) to ground and applying the input voltage $V_{in}$ to the weights G8 to G5' (again, in each case implemented by means of a simple capacitor).

In various other embodiments, more than one redundant weight (particularly with high-resolution converters), unsplit capacitors, a non-capacitive embodiment of the weight, and/or a fully differential embodiment of the network may be implemented.

Figure 3:
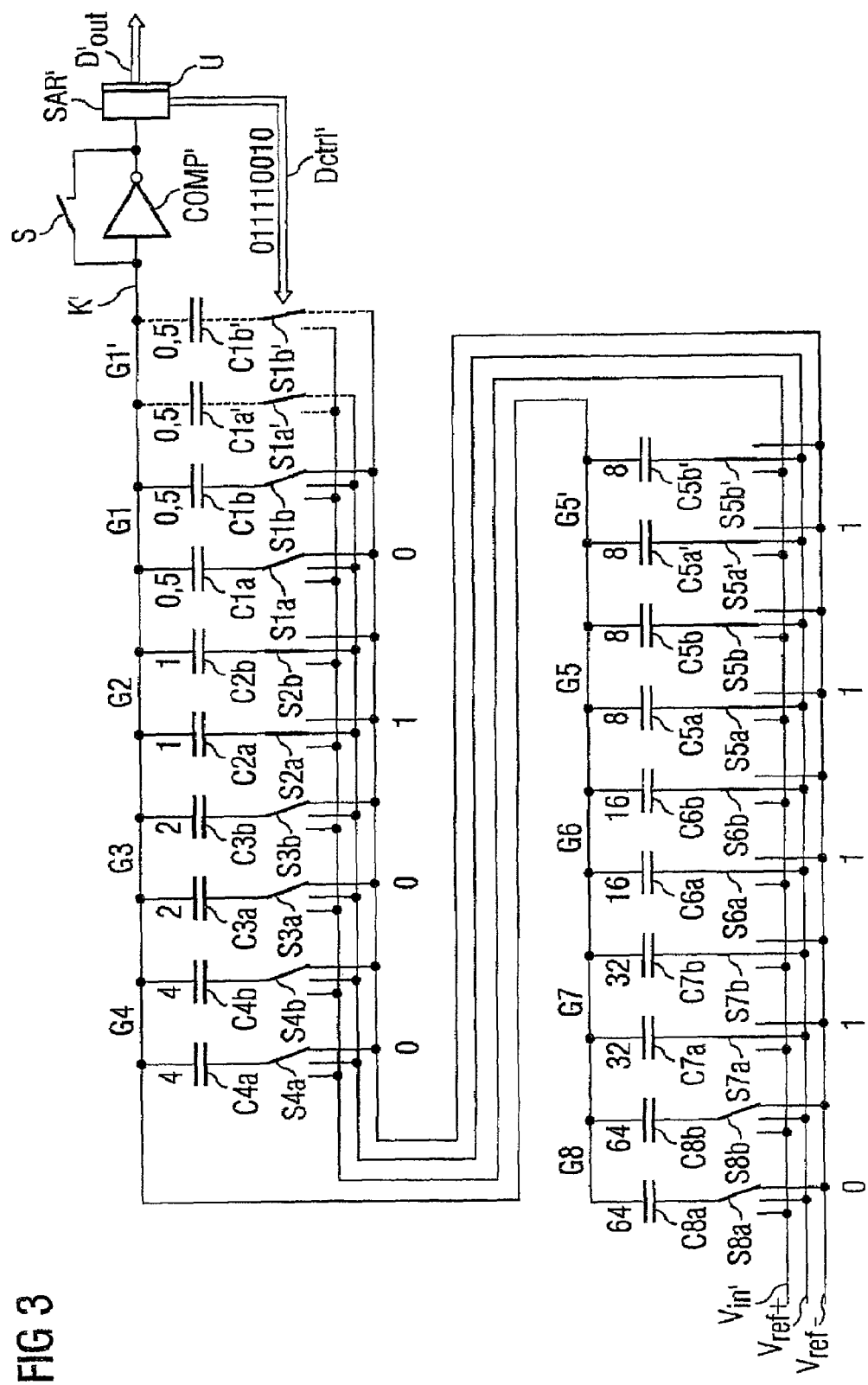
FIG. 3 is a schematic diagram of the embodiment of FIG. 2 towards the end of a conversion phase.

For example, to obtain a fully differential embodiment with differential input signals (e.g., with two oppositely phased single-ended input signals $V_{in+}$ and $V_{in-}$), the embodiments shown in FIG. 2 and FIG. 3 may be extended such that two capacitor networks are provided. In particular, a different network, such as that shown in FIG. 2 and FIG. 3, may be provided for each of the two input signals. In contrast to FIG. 2 and FIG. 3, the two charge nodes of the respective capacitor networks (the node K' in FIG. 2 and FIG. 3) may be in each case connected to the positive and negative inputs, respectively, of a differential amplifier.

Many variations of those described embodiments are also within the scope of the present disclosure. For example, the various embodiments of binary networks described herein may be used as part of any digital/analog conversion, and not necessarily limited to a digital/analog conversion that uses successive approximation.

The invention claimed is:

1. A binary network for an analog/digital converter operating in accordance with a principle of successive approximation, comprising a plurality of circuit nodes each representing one of N binary weights and a plurality of redundant binary weights, wherein each of the binary weights and the redundant binary weights corresponds to a different position of a redundant binary code formed as part of the approximation, wherein N is a whole number greater than one.

2. A binary network for an analog/digital converter operating in accordance with a principle of successive approximation, comprising a plurality of circuit nodes each representing one of N binary weights and at least one redundant binary weight, wherein each of the binary weights and the at least one redundant binary weight corresponds to a different position of a redundant binary code formed as part of the approximation, wherein N is a whole number greater than one, each of the binary weights and the at least one redundant binary weight has a weight value, and the weight value of one of the at least one redundant weight corresponds to the weight value of an Mth most significant weight of the N binary weights, M being a positive whole number smaller than N.

3. The binary network of claim 2, wherein the binary network includes a plurality of N+M capacitors each corresponding to a different one of the N binary weights or the at least one redundant binary weight.

4. The binary network of claim 3, wherein those of the capacitors representing a most significant binary weight through the Mth most significant weight and the at least one redundant binary weight are each switchably connectable to the input signal.

5. A binary network for an analog/digital converter operating in accordance with a principle of successive approximation, comprising a plurality of circuit nodes each representing one of N binary weights and at least one redundant binary weight, each of the binary weights and the at least one redundant binary weight having a weight value, wherein each of the binary weights corresponds to a different position of a redundant binary code formed as part of the approximation, wherein N is a whole number greater than one, and wherein the binary network includes a plurality of groups of capacitors, each group including a plurality of capacitors, each group corresponding to a different one of the binary weights or the at least one redundant binary weight.

6. An analog/digital converter operating in accordance with a principle of successive approximation, comprising:
  a binary network configured to implement digital/analog conversion in accordance with N binary weights and a redundant binary weight, each of the binary weights and the redundant binary weight having a weight value, wherein each binary weight corresponds to a position of a redundant binary code formed as part of the approximation, wherein N is a whole number greater than one; and
  a code converter coupled to the binary network and configured to convert the redundant binary code into a binary output code,
  wherein:
    the weight value of the redundant binary weight corresponds to the weight value of an Mth most significant binary weight of the N binary weights, M being a positive whole number less than N,
    the redundant binary code includes a plurality of N bits each associated with a different one of the binary weights and a bit associated with the redundant binary weight, and
    the code converter is configured to convert the redundant binary code into the binary output code by adding a value of the bit associated with the redundant binary weight in accordance with the weight value of the Mth most significant weight and subtracting an offset value.

7. The analog/digital converter of claim 6, wherein the offset value is $2^{(N-M-1)}$.

8. A method for analog/digital conversion of an input signal in accordance with a principle of successive approximation, the method comprising:
  approximating an input signal using a binary network, wherein the binary network comprises a plurality of circuit nodes each representing one of N binary weights and at least one redundant binary weight, wherein each of the binary weights corresponds to a different position of a redundant binary code formed as part of the approximation, the redundant binary code has a number of bits equal to the number of binary weights and redundant binary weights, and N is a whole number greater than one; and converting the redundant binary code into a binary output code having N bits.

9. The method of claim 8, wherein the binary network includes a plurality of groups of capacitors, each group of capacitors corresponding to a different one of the N binary weights or the at least one redundant binary weights, the method further comprising:

receiving the input signal; and connecting to the input signal the groups of capacitors representing the most significant binary weight through an Mth most significant weight and the at least one redundant binary weight, M being a positive whole number smaller than N.

10. A method for analog/digital conversion of an input signal in accordance with a principle of successive approximation, the method comprising:

approximating an input signal using a binary network, wherein the binary network comprises a plurality of circuit nodes each representing one of N binary weights and at least one redundant binary weight, wherein each of the binary weights corresponds to a different position of a redundant binary code having at least N+1 bits formed as part of the approximation, wherein N is a whole number greater than one and M is a positive whole number smaller than N, wherein each of the binary weights and the at least one redundant binary weight has a weight value, wherein the weight value of the redundant binary weight corresponds to the weight value of an Mth most significant weight of the N binary weights, and wherein the redundant binary code includes a plurality of N bits each associated with a different one of the binary weights and at least one bit associated with the at least one redundant binary weight, the method further comprising converting the redundant binary code into the binary output code by adding a value of the at least one bit associated with the at least one redundant binary weight in accordance with a weighting of the Mth most significant weight and subtracting an offset value.

11. The method of claim 10, wherein the offset value is $2^{(N-M-1)}$.

* * * * *